Sept. 11, 1962 H. NELSON 3,054,034

SEMICONDUCTOR DEVICES AND METHOD OF MANUFACTURE THEREOF

Filed Oct. 1, 1958 2 Sheets-Sheet 1

INVENTOR.
HERBERT NELSON
BY
W. S. Hill
AGENT

INVENTOR.
HERBERT NELSON

BY

W. S. Hill

AGENT

United States Patent Office
3,054,034
Patented Sept. 11, 1962

3,054,034
SEMICONDUCTOR DEVICES AND METHOD OF MANUFACTURE THEREOF

Herbert Nelson, Princeton, N.J., assignor to Radio Corporation of America, a corporation of Delaware Filed Oct. 1, 1958, Ser. No. 764,674
4 Claims. (Cl. 317—235)

Figure 1:
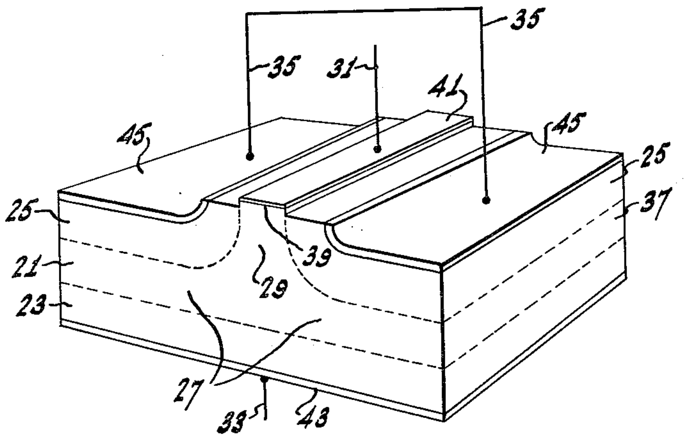

This invention relates to semiconductor devices and to methods of manufacture thereof and particularly, but not necessarily exclusively, to transistors having improved operating characteristics.

Since the advent of the transistor, an outstanding hope has been to achieve a device geometry that would eliminate the effect of the semiconductor surface. Such a device would be unaffected by adverse surface conditions and by surface changes during the life of the device and, further, many of the annoying and costly difficulties associated with present etching techniques, and encapsulation procedures would be eliminated. In addition, such a device would have a higher order of reliability and uniformity.

An object of this invention is to provide improved semiconductor devices.

Another object is to provide transistors having improved operating characteristics.

In general, the invention includes a semiconductor device comprising a base region, a rectifying junction in contact with said base region, and an internal base lead region extending from said base region and through said rectifying junction.

A typical embodiment of the invention is a transistor comprising a wafer of a semi-conducting material having P-type conductivity, such as silicon containing minor amounts of boron and including a base region having two major opposed faces. An emitter electrode is in rectifying contact with one major face of said base region and a collector electrode is in rectifying contact with the other major face of said base region. The emitter and collector electrodes may be prepared by diffusing an N-type impurity, such as phosphorus, into the surface of the wafer to convert the surface region thereof to N-type conductivity. An internal base lead region extends through a central portion of the collector electrode.

By virtue of bringing the base lead region out through the collector electrode, the major current flow in the device is in the central base portions near the base lead region. The central base portions are entirely internal with substantially no surface presented to the major current flow. The base current at the perimeter of the emitter is substantially reduced. As a result, one or more of the following improvements are attained:

(1) *Low surface recombination.*—Since little surface is presented to the base current, markedly less surface recombination of the charge carriers can take place. This feature is important for semiconductor bodies having high surface recombination rates, such as silicon bodies.

(2) *Low saturation resistance.*—The device is symmetrical. When the electrodes are reversed in function, the device exhibits a high alpha (ratio of signal current to load current). The device is therefore particularly adaptable for use as a switch.

(3) *Low base resistance.*—Since there is less surface recombination in the base, more carriers remain available, maintaining a higher conductivity in the base. Further, in conventional transistors, the base is etched around the periphery of the emitter reducing the cross-section of the base and increasing the base resistance.

(4) *Less sensitivity to changes in the surface.*—Since the active region of the base is remote from surfaces of the device, changes in the surface of the device have a lesser affect on the characteristics of the device.

Figure 2:
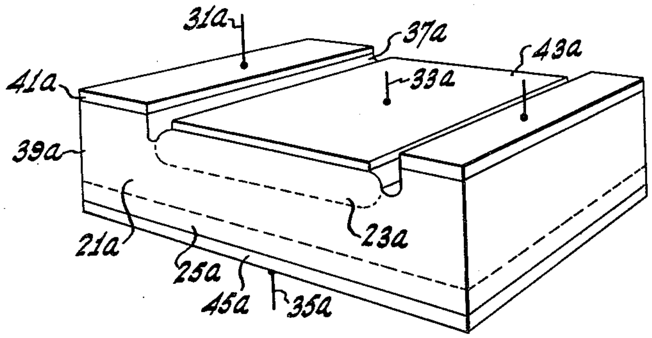
Figure 3A:
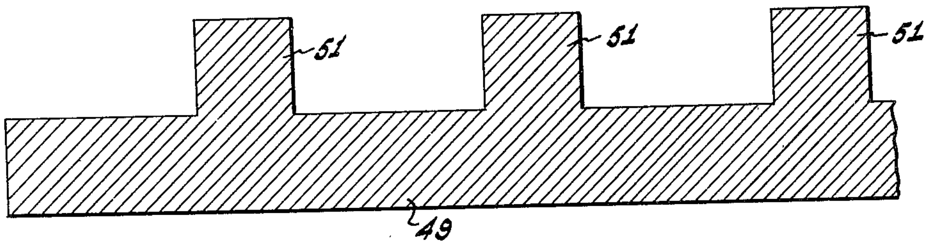
Figure 3B:
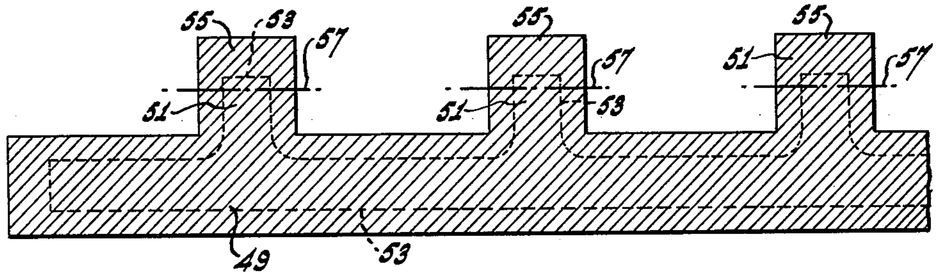
Figure 3C:
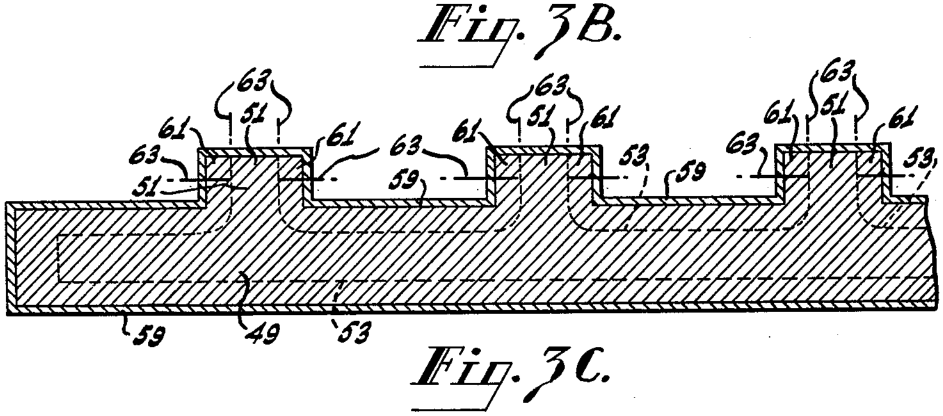
Figure 3D:
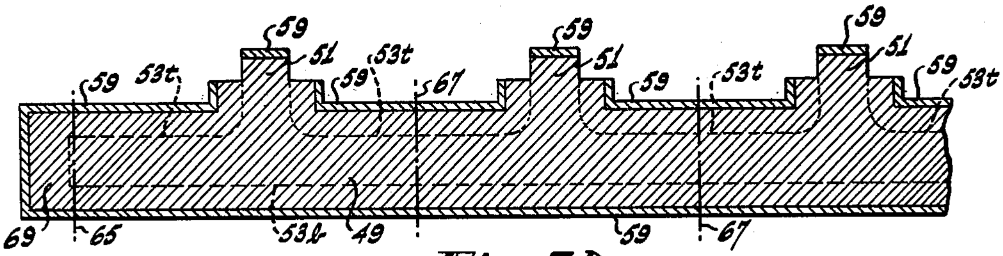
Figure 4:
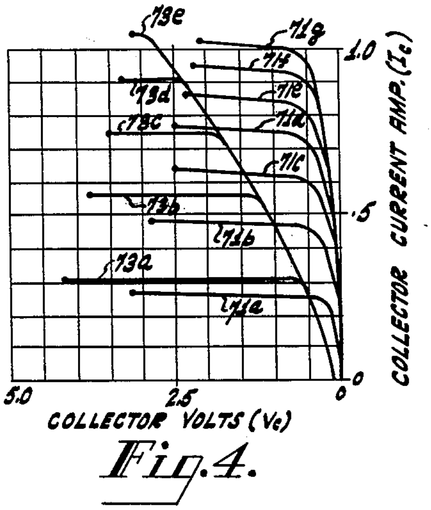
Figure 5:
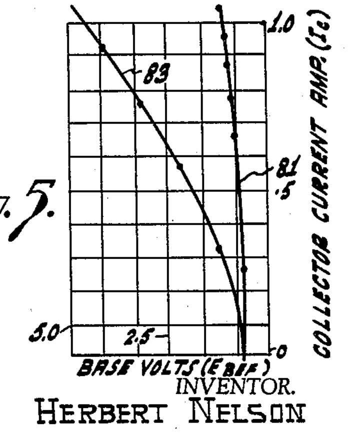

The foregoing objects and advantages of the invention are described in greater detail by reference to the accompanying drawings in which:

FIG. 1 is a perspective view of a typical N-P-N device of the invention,

FIG. 2 is a perspective view of a typical prior art device designed to perform the same function as the device of FIG. 1, FIG. 3A to 3D are sectional views illustrating one method for preparing P-N-P devices of the invention, FIG. 4 is a graph showing the collector current ($I_c$) as a function of collector voltage ($V_c$) for various values of base current ($I_B$) for a typical device of FIGURE 1 and a typical prior art device of FIGURE 2, and FIG. 5 is a graph showing the base voltage ($E_{BEF}$) as a function of collector current ($I_c$) for various values of base current ($I_B$) for a typical device of FIGURE 1 and a typical prior art device of FIGURE 2.

THE DEVICE

FIG. 1 is a typical N-P-N device of the invention. The device comprises base region 21 of a semiconducting material, such as a single crystal of silicon having P-type conductivity. The P-type conductivity may be imparted by the presence of a P-type impurity such as boron, aluminum or gallium.

The base region 21 is substantially plane on its underside and has connected thereto a first rectifying electrode 23, which preferably will function as an emitter of minority charge carriers. The first rectifying electrode 23 may be a part of the same crystal as the base 21 into which an N-type impurity, such as phosphorus, has been diffused to convert its surface region thereof to N-type conductivity.

The upper side of the base region 21 has a narrow rail-like extension or base lead region 29 extending therefrom. The upper surface of the base region 21 on either side of the base lead region 29 is substantially plane and has connected thereto a second rectifying electrode 25 which preferably will function as a collector of minority charge carriers. The second rectifying electrode 25 may be a part of the same crystal as the base 21 into which an N-type impurity, such as phosphorus, has been diffused to convert the surface region thereof into N-type conductivity.

The device therefore comprises a base region of a semiconducting material having a first and second rectifying electrode 23 and 25 attached thereto and an internal base lead region 29 extending through one of the rectifying electrodes.

The base region 21 may be of either an N-type or P-type semiconductor. Some typical semiconductor materials are germanium, silicon, gallium arsenide, indium antimonide, and gallium phosphide. In the case of germanium and silicon N-type conductivity may be imparted by incorporating into the material impurity proportions of a group V element, such as phosphorus, arsenic or antimony; and P-type conductivity may be imparted by incorporating into the material impurity proportions of a group III element, such as boron, aluminum or gallium. In the case of III–V compounds, N-type conductivity may be imparted by incorporating itno the material impurity proportions of a group VI compound, such as sulfur or selenium; and P-type conductivity may be imparted by incorporating into the material impurity proportions of a group II material, such as magnesium or calcium.

The first and second rectifying electrodes 23 and 25 are each a region of opposite conductivity type to that of the base region 21. The rectifying electrodes may be produced by any of the conventional methods, as by alloying or diffusing.

The internal base lead region 29 is ohmically connected to the base region 21. Preferably, the base lead region 29 is a part of the same crystal as the base region 21 and extends through one of the rectifying electrodes. Preferably, the base lead region 29 extends through the second rectifying electrode 25, which is in function as the collector of minority charge carriers and, moreover, may be extended through any portion of the rectifying electrode, preferably, a central portion as a matter of convenience and symmetry.

The outer surfaces of the internal base lead region 29, the emitter 23 and the collector 25 are coated with a metallic conductor, preferably electroless nickel, to provide a base lead plating 41, and emitter plating 43 and a collector plating 45 respectively which provide an ohmic contact thereto. A base connection 31 and emitter connection 33 and a collector connection 35 are soldered to the respective platings. These connections may then be connected for operation as a semiconductor device.

With the first rectifying electrode 23 connected as the emitter and the second rectifying electrode connected as the collector, minority charge carriers are injected principally in central base portions 27 of the base region 21, and to a lesser extent in the regions of the base 21 removed from the central base portions 27 of the base region 21. Similarly, collection of carriers takes place principally from the central portions 27 of the base region. The central base portions 27 present no external surface for surface recombination of the minority charge carriers. The surfaces 37 and 39 of base region 21 are small and remote from the principal path of the minority carrier flow.

For purposes of comparison, a transistor of more conventional geometry is shown in FIG. 2 where structures corresponding to those of FIGURE 1 have corresponding number designations. In the prior art device of FIGURE 2, the surface region **37*a* plays an important role in determining the electrical characteristics of the transistor. This is particularly true when rate of surface recombination, S, is large and when, at high current densities, the injection of minority carriers is crowded toward the perimeter of the emitter by the biasing action of the base current. A relatively large proportion of the injected carriers is then lost at the surface 37*a* and the current transfer ratio of the device, $\alpha_{fe}$, comes to depend rather critically upon the recombination rate at this surface. It has been shown, for instance, that in conventional silicon transistors, $\alpha_{fe}$ may be caused to increase by a factor as large as three as a consequence of a surface treatment which leads to a substantial reduction of S. In the conventional device, the base resistance also varies with S. When the surface recombination rate of the area 37*a*** is high, minority carrier modulation of the underlying base region is low and vice versa.

The new semiconductor device of FIG. 1 has no counterpart of the surface region **37*a* of the old geometry. In the new structure, the biasing effect due to the base current leads to a crowding of injection towards the center rather than towards the perimeter of the emitter. Loss of injected carriers in the new device of FIGURE 1, therefore, can occur only in the relatively remote base lead surface 39** and to bulk recombination. The device is consequently relatively independent of the condition of the surface and $\alpha_{fe}$ is unaffected by a change in surface conditions.

In the new semiconductor devices herein, the loss of injected carriers depends upon the bulk recombination rate, geometrical dimensions and the electric field strength in the neighborhood of the base lead surface 39. No attempt has been made to quantitatively relate these and other pertinent parameters to the current transfer ratio.

Qualitative considerations as well as experimental results indicate that, in silicon transistors, the new geometry is markedly more conducive to the conservation of minority carriers than is the conventional structure. This is particularly true when the width of the internal base lead 29 is a minimum.

The loss of injected minority carriers to the base lead surface 39 depends importantly upon the width of the base lead 29 but not as critically as one might expect. Since the distance between the emitter and the base lead surface 39 is much greater than the base width, it follows that the diffusion gradients will drive many more carriers to the collector than to the base lead surface 39. In the internal base lead region 29, minority carrier flow to the collector is favored by the direction of the diffusion gradient. Consequently, the base lead region can be made wide enough to be compatible with practicable fabrication procedures without giving rise to a substantial loss of minority charge carriers.

A comparison of the two geometries in FIGURES 1 and 2 suggests further advantages for the new semiconductor devices herein with regard to base and saturation resistance. Since few injected charge carriers are lost directly to a base surface 37 adjacent to the emitter 23, a more effective modulation of the resistivity of the internal base lead resistance may be attained. At high minority carrier injection levels the base lead region 29 becomes flooded with minority carriers which greatly increase its conductivity.

Low saturation resistance in the new device is a consequence of its high degree of symmetry. The loss of injected minority charge carriers in this device is somewhat greater when operated under inverse conditions (emitter and collector interchanged) than under normal conditions. This difference is small, however, since it derives solely from the fact that the base lead surface 39 collects a slightly greater fraction of the injected carriers under inverse than under normal operating conditions. As a consequence, the condition for low saturation resistance (an inverse current transfer ratio, $\alpha_{re}$, nearly equal to the normal current transfer ratio, $\alpha_{fe}$) can be attained in the new transistor structure.

*Fabrication*

One or more semiconductor devices of the invention may be prepared at one time from a single crystal by the lapping and diffusion technique described in H. Nelson, "The Preparation of Semiconductor Devices by Lapping and Diffusion Techniques," Proceedings of the I.R.E., vol. 46, No. 6 (June 1958), pages 1062 to 1067. A preferred method for preparing P-N-P semiconductor devices is described in connection with FIGURES 3A to 3D.

A single crystal wafer 49 of N-type silicon having a resistivity of 1 to 3 ohm cm. is provided. The crystal wafer 49 may be of any convenient size. For example, the wafer may be about one inch long, about ½ inch wide and about 10 mils (0.010 inch) thick. The P-type conductivity is imparted by the presence of impurity proportions of phosphate in the water.

The wafer 49 is now lapped to reduce the thickness of the wafer to about 5 mils and to provide rail-like extension 51 (later to include the base lead region) about 8 mils wide, 5 mils high and spaced about 100 mils apart, as shown in FIG. 3A.

The lapped wafer 49 is now treated in an atmosphere which will induce the opposite conductivity type into the surface of the crystal. In this example, the atmosphere will induce P-type conductivity in the surface of the wafer 49. One suitable technique is to heat the wafer 49 for about 3 minutes at about 1200° C. in a flowing atmosphere consisting essentially of a mixture in the proportions of about 1 volume boron trichloride and 300 volumes of nitrogen. Some of the boron trichloride reacts with the silicon and boron deposits on the surface of the wafer. The atmosphere is then changed to pure nitrogen and the wafer 49 is heated for about 8½ hours at about 1300° C. The boron diffuses into the wafer during the heating and forms a thin layer 53 of P-type conductivity over the entire surface of the wafer. The P-type layer 53 has been examined and found to be about 2.1 mils thick. A P-N junction is formed at the entire interface of the P-type layer 53 and the N-type bulk of the wafer 49 as shown in FIG. 3B.

The wafer 49 is now lapped to remove the tops 55 of the rail-like extensions 51 so as to expose the non-diffused region of the extension. As shown in FIG. 3B, the tops 55 are removed down to line 57 just below the diffused P-type layer 53, a distance of about 2 mils, and leaving the extension 51 about 3 mils high.

The surface of the wafer 49 is cleaned to remove oxides, grease, etc., before covering the entire surface of the wafer with a layer 59 of a metallic conductor which produces an ohmic contact without adversely affecting the electric properties of the wafer. Electroplated nickel is suitable for this purpose. A bright adherent nickel plating may be deposited over the surface of the wafer 49 by the electroless nickel plating technique described in M. V. Sullivan and J. H. Eigler, "Electroless Nickel Plating for Making Contacts to Solicon," Journal of the Electrical Chemical Society, vol. 104 (April 1957), pages 226 to 229. A satisfactory plating is about 2 microns thick.

Notches 61 are removed from the upper portion of the rail-like extension 51 to isolate the P-type diffused region 53 from the top of the rail-like extension 51. This is preferably accomplished by the aforementioned lapping technique by removing the material down to the line 63 of FIG. 3C. The notches may be etched by a conventional technique to further adjust the isolation to a desired value. Etching may be accomplished by applying a conventional silicon etchant for about 5 seconds. The etched surface is then rinsed with distilled water to remove the excess reagent.

The ends 69 of the wafer are removed to isolate the upper and lower P-type diffused layers 53, now designated **53*t* and 53*b* respectively. This may be accomplished by cutting off the edges 69 as by sawing along the line 65** as shown in FIG. 3D.

The wafer is then diced; that is, cut into conveniently sized, generally rectangular, individually shaped devices. The wafer may be diced by vertical cuts along 67 of FIG. 3D and similar vertical cuts parallel to the surface of the illustrated section.

Finally, the diced units may be mounted and connections soldered to the metallic conductor 59 residing on the two P-type regions **53*t* and 53*b* and on the N-type region 51**.

Similar P-N-P devices may be prepared by similar processes substituting other N-type semiconductor materials for the starting wafer and other P-type impurities during the processes. Also N-P-N devices may be prepared by substituting P-type silicon or other P-type semiconductor materials for the N-type silicon of the example, and by substituting an N-type impurity for the P-type impurity and a P-type impurity for a N-type impurity wherever they appear.

EXPERIMENTAL RESULTS

Silicon N-P-N transistors prepared in a manner similar to that described in the preceding section and illustrated in FIGURE 1 were subjected to tests for comparison with comparable conventional N-P-N silicon units illustrated in FIGURE 2. The comparison was primarily concerned with surface immunity, base resistance, and saturation resistance. Because the new transistors herein have a high surface immunity, they are referred to as surface immune transistors.

*Table I*

EFFECT OF SURFACE TREATMENT ON CURRENT TRANSFER CHARACTERISTICS OF SURFACE IMMUNE AND "CONVENTIONAL" SILICON POWER TRANSISTORS

| Unit | $\alpha_{fe}$ | $\alpha_{fe}$[1] | L mils | W mils |
|---|---|---|---|---|
| | Surface Immune Units | | | |
| G12 | 16.0 | 17.5 | 4 | 0.9 |
| G14 | 18.2 | 20.0 | 4 | 0.85 |
| G15 | 12.3 | 14.0 | 7 | 0.8 |
| G17 | 13.5 | 15.6 | 7 | 0.85 |
| | "Conventional" Units ($W$ = 0.7 mils) | | | |
| A2 | 7.4 | 30.0 | ------ | ------ |
| A3 | 8.4 | 29.1 | ------ | ------ |

[1] After sodium dichromate treatment.
All values of alpha measured at $V_c$=6 volts. $I_e$=50 ma.

Test results concerned with surface immunity are shown in Table I. The data represents conventional N-P-N transistors A2 and A3, and surface immune N-P-N units—G12, G14, G15, and G17. As expected, a large difference in surface immunity is indicated. The current transfer ratio $\alpha_{fe}$, of the conventional units varies greatly with surface changes while that of the new-geometry units remains substantially unchanged. Data in Table I show how $\alpha_{fe}$ decreases with an increase in the width, L, of the internal base lead region. The transistors G14 and G17, for instance, have equal base widths, but the former with a smaller value of L shows a higher $\alpha_{fe}$.

*Table II*

CURRENT TRANSFER CHARACTERISTICS OF SURFACE IMMUNE TRANSISTORS UNDER NORMAL AND INVERSE OPERATING CONDITIONS

| Unit | Normal Operation | | Inverted Operation | | L mils | W mils |
|---|---|---|---|---|---|---|
| | $\alpha_{fe}$ | $\alpha_{fe}$[1] | $\alpha_{re}$ | $\alpha_{re}$[1] | | |
| G18 | 14.0 | 16.2 | 6.4 | 9.5 | 4 | 1.0 |
| G19 | 14.8 | 16.2 | 6.4 | 10.5 | 7 | 0.75 |
| A4[2] | 17.3 | ------ | <1.0 | ------ | ------ | ------ |

[1] After radium dichromate treatment.
[2] "Conventional" transistor included for comparison.
All values of gain measured at $V_c$=6 v., $I_e$=50 ma.

The data in Table II compare normal and inverse operation of two surface immune transistors. The results indicate a high degree of symmetry for these transistors in that the values $\alpha_{re}$ are not greatly lower than $\alpha_{fe}$. The results also show that $\alpha_{re}$ is more affected by surface treatments than is $\alpha_{fe}$. This probably is caused by the surface region 39 (see FIG. 1) which should have a greater effect upon minority carrier loss in inverted than in normal operation.

Common emitter collector characteristics of new (curves **71*a* to 71*g*) and the conventional (curves 73*a* to 73*e***) devices are shown by the two families of curves in FIG. 4. The curves show collector current as a function of collector current as a function of collector voltage at $I^b$=20, 40, 60 ma., etc. to a collector current maximum of about one ampere. The low saturation resistance of the new device is strikingly evidenced by the early sharp rise of collector current with voltage. As determined from these curves the saturation resistances of the new and the "conventional" devices are 0.4 and 2.5 ohms, respectively.

The transfer characteristics of the new (curve 81) and the conventional (curve 83) devices are shown by the two families of curves of FIGURE 5. The curves show how the base-emitter voltage, $V_{BEF}$, varies with the collector current $I_c$ in the same units. The rate of change of $V_{BEF}$ with collector current at high values of this current is a measure of the rate of change in the voltage drop across the base resistance $R_b$. This resistance can therefore be calculated from these curves on the basis of known values of $\alpha_{fe}$ of the units. In this manner the $R_b$ was determined to be approximately 3.5 ohms for the surface immune unit and 52 ohms for the conventional device.

What is claimed is:

1. A semiconductor device comprising a semiconductor base region having two opposed faces, a first rectifying electrode in contact with one of said faces, a second rectifying electrode in contact with the other of said faces, an internal base lead region extending from said base region and through said second rectifying electrode, a first ohmic contact to said base region, a second ohmic contact to said first rectifying electrode and a third ohmic contact to said second rectifying electrode.

2. A transistor comprising a semiconductor base region of a particular conductivity type and having two major opposed faces, an emitter electrode in rectifying contact with one major face of said base region, a collector electrode in rectifying contact with the other major face of said base region, said emitter and collector electrodes being of the opposite conductivity type to said base region, an internal base lead region extending from said base region and through a central portion of said collector electrode, a first ohmic contact to said base region, a second ohmic contact to said emitter electrode, and a third ohmic contact to said collector electrode, said ohmic contacts each comprising a metal plating on said region and electrodes.

3. A transistor comprising a semiconductor base region having N-type conductivity and having two major opposed faces, an emitter electrode in rectifying contact with one major face of said base region, a collector electrode in rectifying contact with the other major face of said base region, said emitter and collector electrodes having P-type conductivity, an internal base lead region extending from said base region and through a central portion of said collector electrode, a first ohmic contact to said base region, a second ohmic contact to said emitter electrode, and a third ohmic contact to said collector electrode, said ohmic contacts each comprising a metal plating on said region and electrodes.

4. A transistor comprising a semiconductor base region having P-type conductivity and having two major opposed faces, an emitter electrode in rectifying contact with one major face of said base region, a collector electrode in rectifying contact with the other major face of said base region, and emitter and collector electrodes having N-type conductivity, an internal base lead region extending from said base region and through a central portion of said collector electrode, a first ohmic contact to said base region, a second ohmic contact to said emitter electrode, and a third ohmic contact to said collector electrode, said ohmic contacts each comprising a metal plating on said region and electrodes.

References Cited in the file of this patent

UNITED STATES PATENTS

| | | |
|---|---|---|
| 2,861,018 | Fuller et al. | Nov. 18, 1958 |
| 2,862,160 | Ross | Nov. 25, 1958 |
| 2,866,140 | Jones et al. | Dec. 23, 1958 |
| 2,878,147 | Beale | Mar. 17, 1959 |
| 2,879,188 | Strull | Mar. 24, 1959 |
| 2,910,634 | Rutz | Oct. 27, 1959 |

UNITED STATES PATENT OFFICE

CERTIFICATE OF CORRECTION

Patent No. 3,054,034 September 11, 1962

Herbert Nelson

It is hereby certified that error appears in the above numbered patent requiring correction and that the said Letters Patent should read as corrected below.

Column 4, line 60, for "phosphate in the water" read -- phosphorus in the wafer --; column 5, line 25, for "Solicon" read -- Silicon --; column 6, line 62, strike out "current as a function of collector --; line 63, for "$I^b$" read -- $I_b$ --.

Signed and sealed this 27th day of August 1963.

(SEAL)
Attest:

ERNEST W. SWIDER
Attesting Officer

DAVID L. LADD
Commissioner of Patents